United States Patent
Yoshida

(10) Patent No.: US 10,270,449 B2
(45) Date of Patent: Apr. 23, 2019

(54) HIGH-VOLTAGE LEVEL SHIFT CIRCUIT AND DRIVE APPARATUS

(71) Applicant: Mitsubishi Electric Corporation, Tokyo (JP)

(72) Inventor: Hiroshi Yoshida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/836,088

(22) Filed: Dec. 8, 2017

(65) Prior Publication Data

US 2018/0316352 A1 Nov. 1, 2018

(30) Foreign Application Priority Data

Apr. 26, 2017 (JP) .................................. 2017-087490

(51) Int. Cl.
| | |
|---|---|
| H03K 19/0175 | (2006.01) |
| H03K 19/0185 | (2006.01) |
| H03K 3/012 | (2006.01) |
| H03K 3/356 | (2006.01) |

(52) U.S. Cl.
CPC ..... *H03K 19/018528* (2013.01); *H03K 3/012* (2013.01); *H03K 3/356165* (2013.01)

(58) Field of Classification Search
CPC ................. H03K 17/14; H03K 17/145; H03K 19/018521; H03K 19/018528; H03K 19/0185

See application file for complete search history.

(56) References Cited

U.S. PATENT DOCUMENTS

| | | | |
|---|---|---|---|
| 9,112,460 B2 * | 8/2015 | Okamoto ............ | H03F 3/45076 |
| 2008/0088353 A1 * | 4/2008 | Kuo ........................ | H02M 3/07 |
| | | | 327/333 |

FOREIGN PATENT DOCUMENTS

JP 2010-161753 A 7/2010

* cited by examiner

*Primary Examiner* — Hai L Nguyen
(74) *Attorney, Agent, or Firm* — Studebaker & Brackett PC

(57) ABSTRACT

A high-voltage level shift circuit includes: a first high withstand voltage NMOS transistor driven by an on command; a second high withstand voltage NMOS transistor driven by an off command; a first PMOS current mirror circuit inputting a drain current of the first high withstand voltage NMOS transistor to a reference side; a second PMOS current mirror circuit inputting a drain current of the second high withstand voltage NMOS transistor to a reference side; a first NMOS current mirror circuit inputting an output current of the second PMOS current mirror circuit to a reference side; and an I/V signal conversion circuit receiving an output of the first PMOS current mirror circuit and an output of the first NMOS current mirror circuit to obtain an output control voltage signal.

8 Claims, 8 Drawing Sheets

HIGH-VOLTAGE LEVEL SHIFT CIRCUIT AND DRIVE APPARATUS

BACKGROUND OF THE INVENTION

Field

The present invention relates to a drive apparatus that drives a power device such as an IGBT or MOSFET, and a high-voltage level shift circuit used for the drive apparatus.

Background

FIG. 9 is a diagram illustrating a conventional drive circuit. The drive circuit is provided with a high-voltage level shift circuit 100, a transmission circuit 101 and a driver circuit 102. The high-voltage level shift circuit 100 includes resistors R1 and R2, and high withstand voltage field-effect transistors (hereinafter referred to as "HNMOS transistors") T1 and T2. The transmission circuit 101 includes an RS-type flip flop 103, NOR gates 104 and 105, NAND gates 106 and 107, I/V signal conversion circuit gates 108 and 109, and a mask signal circuit 110 made up of an AND gate. The driver circuit 102 is connected to a power device and drives the power device through its output signal.

A high-potential side signal is inputted to the high-voltage level shift circuit 100 for controlling an on/off operation of the power device. The high-potential side signal is a pulsed signal, inputted to T1 and T2 of the high-voltage level shift circuit 100 and level-shifted to a high potential. The level-shifted on signal or off signal is transmitted from the driver circuit 102 to the power device via the transmission circuit 101.

Generally, a load of a power device driven by a drive circuit is often an inductance load such as a motor. Under influences of a parasitic inductance component due to an inductance load, wiring on a printed wiring board or the like, a high-potential side reference potential VS of the drive circuit at the time of switching fluctuates toward a negative side with respect to a low potential side ground GND. The high-potential side signal becomes an error signal when the high-potential side reference fluctuating toward the negative side is restored to a low potential side reference. Furthermore, this error signal may also be generated by dV/dt when the high-potential side reference potential transitions from a low potential to a high potential.

The error signal causes a current to flow into the level shift resistors R1 and R2 connected to a high-potential side power supply via the parasitic capacitances or parasitic diodes of T1 and T2. This causes a voltage drop and causes the error signal to be transmitted to the transmission circuit 101 at the following stage, which may induce a malfunction of the power device.

As a countermeasure for this malfunction, a logic filter scheme is used in a conventional drive circuit. That is, a mask signal circuit 110 that generates a signal for cancelling an error signal is provided. More specifically, the mask signal circuit 110 generates a mask signal for masking, when both an on signal and an off signal become active, these signals so that they are not transmitted to the RS-type flip flop 103. This mask signal is used to mask main signals outputted from the NAND gates 106 and 107. At this time, although the main signal and the mask signal are set to the same operation region, if a variation occurs in each operation region, an error signal may be transmitted to the transmission circuit 101 at the following stage.

FIG. 10 is a timing chart illustrating operation of a conventional drive circuit. A case is assumed here where an on signal or an off signal, which is an output of the high-voltage level shift circuit 100, abruptly drops under influences of dV/dt or the like and a threshold of the NAND gate 106 or 107 is different from a threshold of the mask signal circuit 110 due to a variation or the like. The threshold of the NAND gate 106 or 107 is shown by a broken line B' and the threshold of the AND gate of the mask signal circuit 110 is shown by a broken line A'. In this case, a range in which the mask signal is active (high) is narrower than a range in which the main signal becomes inactive (low) due to some trouble. For this reason, the error signal which is the main signal that is erroneously inactivated is not sufficiently masked. Thus, an error signal is generated in a latch input signal which is a set input signal of the RS-type flip flop 103.

In contrast, a level shift circuit that provides a stable operation is disclosed (e.g., see JP 2010-161753 A). However, in addition to an HVNMOS that generates a level shift current, a current is caused to steadily flow into a level shift circuit by another constant current source for stable operation.

SUMMARY

In the case where level shift is performed in a high voltage system such as a 600-V or 1200-V system, a current involved in a high-voltage level shift needs to be eliminated to the utmost to reduce a heating value. Therefore, there is a demand for a high-voltage level shift circuit that reduces a current without using any separate constant current source which would be indispensable in the prior art.

The present invention has been implemented to solve the above-described problem, and it is an object of the present invention to provide a high-voltage level shift circuit and a drive apparatus capable of reducing a current while preventing transmission of an error signal.

According to the present invention, a high-voltage level shift circuit includes: a first high withstand voltage NMOS transistor driven by an on command; a second high withstand voltage NMOS transistor driven by an off command; a first PMOS current mirror circuit inputting a drain current of the first high withstand voltage NMOS transistor to a reference side; a second PMOS current mirror circuit inputting a drain current of the second high withstand voltage NMOS transistor to a reference side; a first NMOS current mirror circuit inputting an output current of the second PMOS current mirror circuit to a reference side; and an I/V signal conversion circuit receiving an output of the first PMOS current mirror circuit and an output of the first NMOS current mirror circuit to obtain an output control voltage signal.

In the present invention, the first and second PMOS current mirror circuits inputs the drain currents of the first and second high withstand voltage NMOS transistors to the reference sides respectively, the first NMOS current mirror circuit inputs the output current of the second PMOS current mirror circuit to the reference side, and the I/V signal conversion circuit receives the output of the first PMOS current mirror circuit and the output of the first NMOS current mirror circuit to obtain the output control voltage signal. This makes it possible to reduce a current while preventing transmission of an error signal.

Other and further objects, features and advantages of the invention will appear more fully from the following description.

DESCRIPTION OF EMBODIMENTS

A high-voltage level shift circuit and a drive apparatus according to the embodiments of the present invention will be described with reference to the drawings. The same components will be denoted by the same symbols, and the repeated description thereof may be omitted.

First Embodiment

Figure 1:
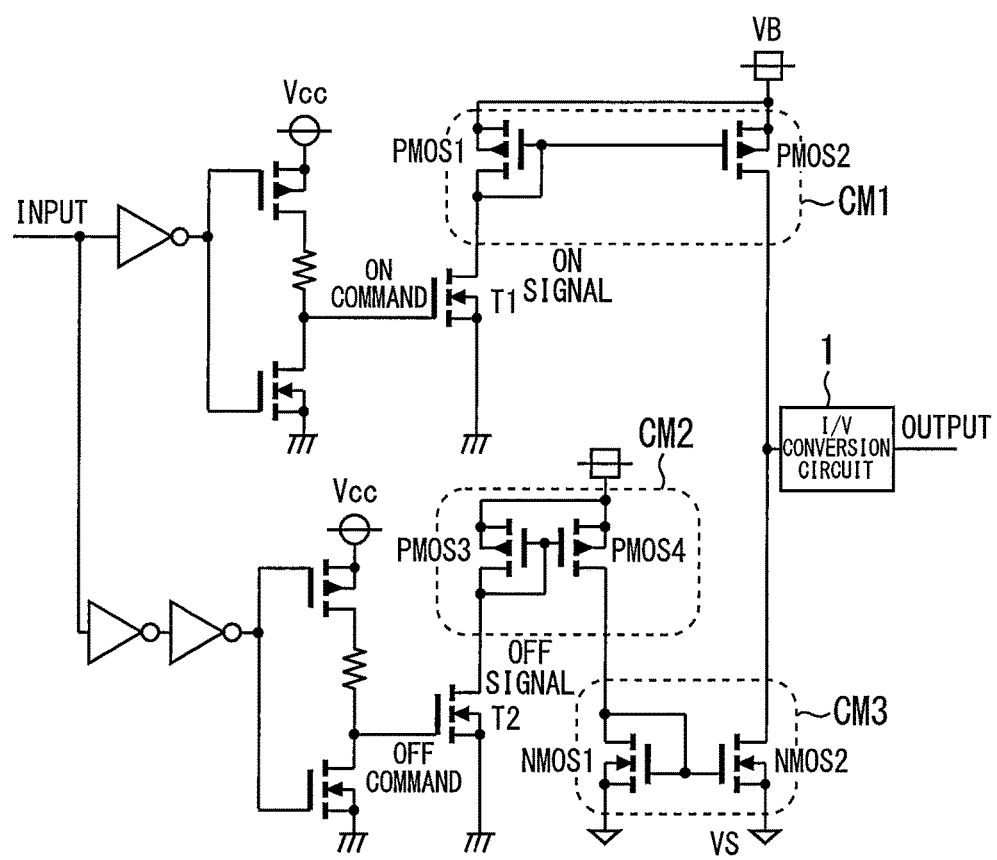
FIG. 1 is a diagram illustrating a high-voltage level shift circuit according to a first embodiment of the present invention.

FIG. 1 is a diagram illustrating a high-voltage level shift circuit according to a first embodiment of the present invention. A high-potential side signal for commanding an on/off operation of a power device is inputted to a high-voltage level shift circuit. This high-potential side signal is a DC signal, and is inputted to T1 and T2 which are high withstand voltage field-effect (HNMOS) transistors respectively, becomes a current signal and is level-shifted to a high potential. That is, the T1 is driven by an on command and outputs an on signal for controlling the power device so as to turn on. The T2 is driven by an off command and outputs an off signal for controlling the power device so as to turn off. The on signal and the off signal are generically called "main signals."

A current mirror circuit CM1 includes a PMOS1 and a PMOS2 which are PMOS transistors and inputs a drain current of the T1 to a reference side. The gate and the drain of the PMOS1 are mutually connected and are also connected to the gate of the PMOS2. The PMOS2 causes a drain current corresponding to a predetermined ratio of the drain current of the PMOS1 to flow.

A current mirror circuit CM2 includes a PMOS3 and a PMOS4 which are PMOS transistors and inputs a drain current of the T2 to a reference side. The gate and the drain of the PMOS3 are mutually connected and are also connected to the gate of the PMOS4. The PMOS4 causes a drain current corresponding to a predetermined ratio of the drain current of the PMOS3 to flow.

A current mirror circuit CM3 includes an NMOS1 and an NMOS2 which are NMOS transistors and inputs an output current of the current mirror circuit CM2 to a reference side. The gate and the drain of the NMOS1 are mutually connected and are also connected to the drain of the PMOS4.

A joint between the drain of the PMOS2 and the drain of the NMOS2 is connected to an input of an I/V signal conversion circuit 1. The I/V signal conversion circuit 1 receives an output of the current mirror circuit CM1 and an output of the current mirror circuit CM3 to obtain an output control voltage signal.

Next, operation of the high-voltage level shift circuit according to the present embodiment will be described. The on signal generated when the T1 is turned on causes the PMOS2 to flow a drain current at a predetermined ratio through the operation of the current mirror circuit CM1. In this case, the T2 is in an off state and no current flows through the PMOS3, PMOS4 or NMOS1, and the NMOS2 remains in a high impedance state in which no current is allowed to flow. Therefore, no steady current flows into the joint between the drain of the PMOS2 and the drain of the NMOS2, a voltage level thereof becomes substantially equivalent to that of a power supply. The I/V signal conversion circuit 1 outputs this as an output control voltage signal of the on signal. On the other hand, when the T2 is in an on state, the NMOS2 tries to cause a predetermined current to flow, but since the PMOS2 has a high impedance, still no steady current flows into the joint between the drain of the PMOS2 and the drain of the NMOS2 and the I/V signal conversion circuit 1 outputs an output control voltage signal of an off signal.

Behavior when currents flow simultaneously through the PMOS1 and the PMOS3 despite the fact that neither T1 nor T2 receives any main signal due to high-voltage potential transition or the like will be described. When currents flow through both the PMOS1 and the PMOS3, currents are made to flow through the PMOS2 and the NMOS2 respectively through operations of the current mirror circuits CM1, CM2 and CM3.

During a steady state, one of the T1 and T2 is in an on state and the other is in an off state. For example, when the T1 is in on state, the PMOS2 has a low impedance compared to the NMOS2, and an input of the I/V signal conversion circuit 1 is at H level. Even when currents flow through both the PMOS1 and the PMOS3 due to high-voltage potential transition or the like in that state, the current flowing through the PMOS1 is greater than the current flowing through the PMOS3 by the current of a main signal. That is, the current of the PMOS2 is greater than the current of the NMOS2, and so the input to the I/V signal conversion circuit 1 is kept at H level and the output logic is never erroneously inverted. On the other hand, when the T2 is in an on state, the current of the NMOS2 is greater than the current of the PMOS2 in contrast to the above-described case, and so the input of the I/V signal conversion circuit 1 is kept at L level and the output logic is still not erroneously inverted.

Similar effects can also be obtained when the main signal is pulse-driven. In the case of pulse-driving, both the PMOS2 and the NMOS2 have high impedances during a steady state and the input voltage of the I/V signal conversion circuit 1 is determined depending on which of an on signal or an off signal is inputted to the high-voltage level shift circuit. If currents are simultaneously made to flow through the PMOS1 and the PMOS3 in this state, potential transition takes place at the input voltage of the I/V signal conversion circuit 1 due to a difference in impedance between the PMOS2 and the NMOS2. Therefore, compared to a scheme independent of the difference as in the case of the prior art, an error signal itself is weakened and erroneous output inversion is unlikely to occur. This can be put in another way that pairing, which has been a problem in the prior art and is required for generation of a mask signal generated from an on signal and an off signal, is relaxed.

When the potential of the high-voltage side power supply becomes a lower potential than the low-voltage side reference potential due to switching or the like of the power device, all the PMOS1, PMOS2, PMOS3, PMOS4, NMOS1 and NMOS2 have high impedances. Since the input voltage to the I/V signal conversion circuit 1 keeps its immediately preceding state, it is still possible to prevent erroneous output inversion. The present embodiment makes it possible to easily make wider than the prior art, the signal transmittable region when the high-voltage side reference potential falls below the low-voltage side reference potential.

Assuming that the high-voltage side supply voltage is fixed, if the high-voltage side reference potential falls below the low-voltage side reference potential, a potential difference between both ends of the high-voltage level shift circuit, that is, a potential difference between the high-voltage side power supply and the low-voltage side reference potential is narrowed, preventing flows of sufficient currents into the T1 and T2. This is because a gate-drain voltage necessary for a MOS transistor to cause a current to flow in the present embodiment is generally lower than a threshold of the I/V signal conversion circuit that receives a high-voltage level-shifted main signal as a voltage signal as in the case of the prior art. Therefore, it is possible to remove an error signal generated based on a displacement current when high-voltage transition or the like takes place and prevent unintentional output logical inversion.

As described above, according to the present embodiment, the current mirror circuits CM1 and CM2 input the drain currents of the T1 and T2 to the reference side respectively, the current mirror circuit CM3 inputs the output current of the current mirror circuit CM2 to the reference side, and the I/V signal conversion circuit 1 inputs the output of the current mirror circuit CM1 and the output of the current mirror circuit CM3, and an output control voltage signal is thereby obtained. This makes it possible to reduce a current while preventing transmission of an error signal.

Figure 2:
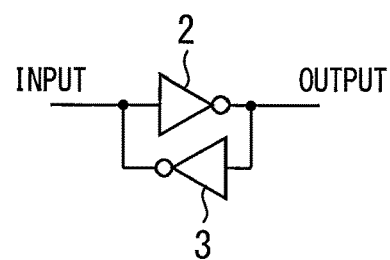
FIG. 2 is a diagram illustrating the I/V signal conversion circuit according to the first embodiment of the present invention.

FIG. 2 is a diagram illustrating the I/V signal conversion circuit according to the first embodiment of the present invention. The I/V signal conversion circuit 1 is a latch circuit in which two inverters 2 and 3 are connected in reversely parallel to each other. Even when the above-described high impedance state continues, this latch effect prevents the input to the I/V signal conversion circuit 1 from becoming unstable.

Figure 3:
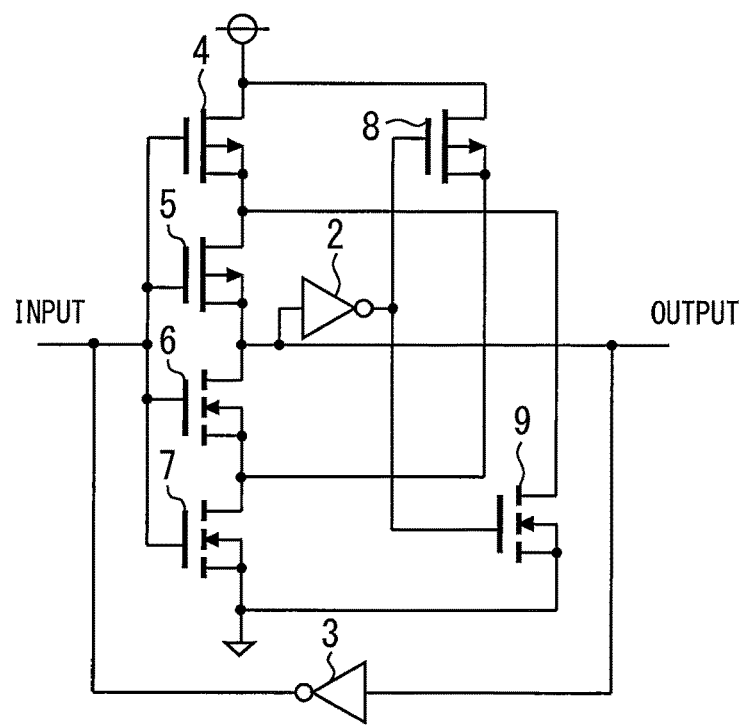
FIG. 3 is a diagram illustrating a modification of the I/V signal conversion circuit according to the first embodiment of the present invention.

FIG. 3 is a diagram illustrating a modification of the I/V signal conversion circuit according to the first embodiment of the present invention. The I/V signal conversion circuit 1 is a Schmitt trigger circuit including inverters 2 and 3, and transistors 4 to 9. Since the Schmitt trigger circuit has a hysteresis in an input threshold voltage, stability is increased.

Figure 4:
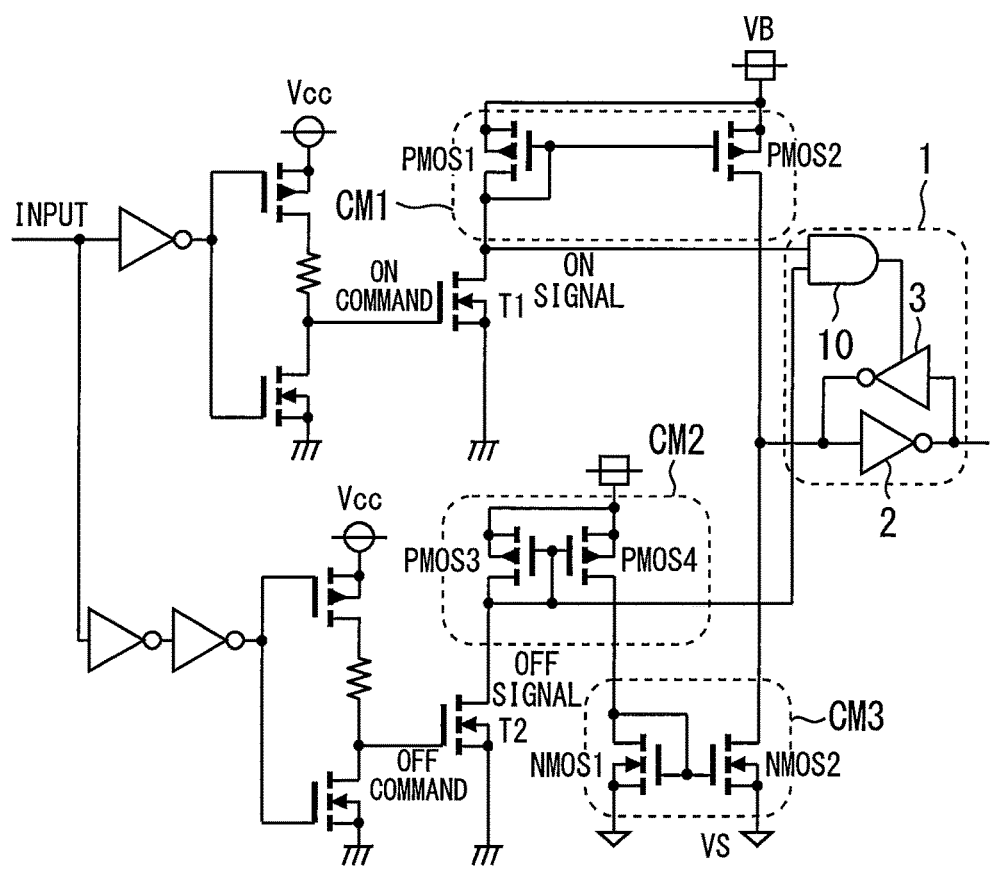
FIG. 4 is a diagram illustrating a modification of the high-voltage level shift circuit according to the first embodiment of the present invention.

FIG. 4 is a diagram illustrating a modification of the high-voltage level shift circuit according to the first embodiment of the present invention. The inverter 3 on the feedback side of the I/V signal conversion circuit 1 is constructed of a three-state buffer. The inverter 3 is controlled by an AND circuit 10 that receives drain voltages of the T1 and T2 to cause the I/V signal conversion circuit 1 to perform latch operation only when no signal is inputted, causing high impedance. In this way, when the high-voltage level shift circuit is pulse-driven, it is possible to prevent interference with transmission of an on signal and off signal of output by the latch circuit and stabilize the output by latching when no signal is inputted. It is also possible to reduce current consumption. It is also possible to stabilize the output even when no current is further made to flow by DC drive.

Second Embodiment

Figure 5:
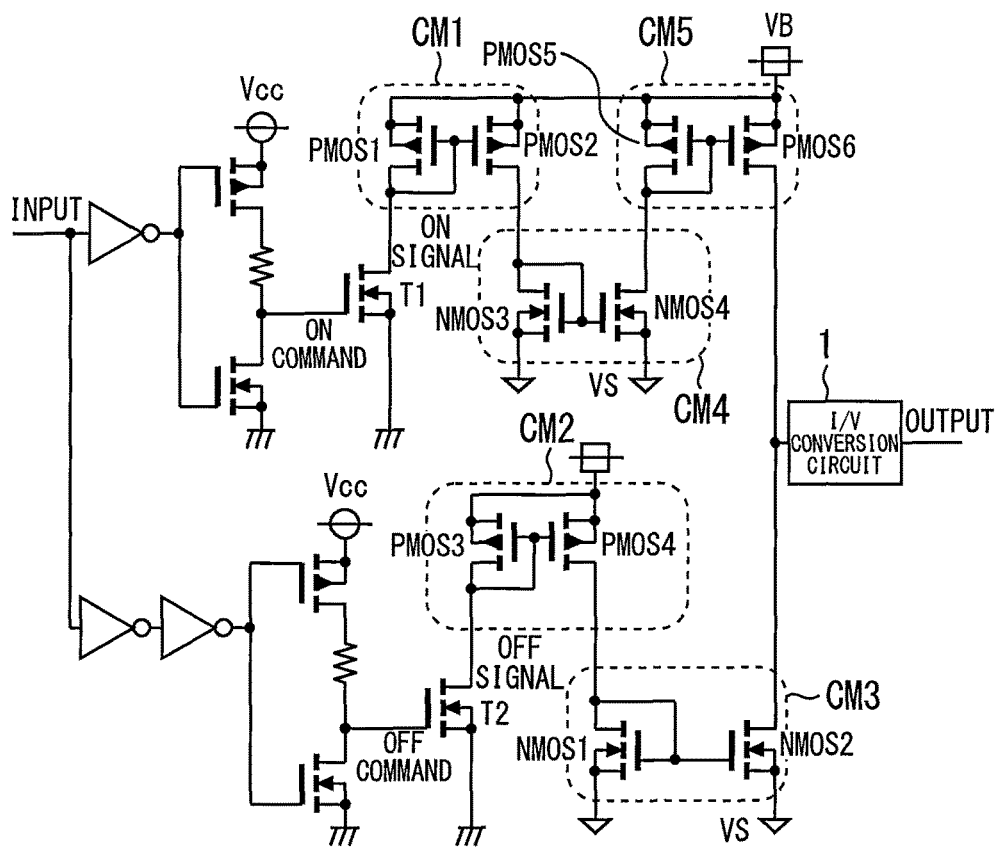
FIG. 5 is a diagram illustrating a high-voltage level shift circuit according to a second embodiment of the present invention.

FIG. 5 is a diagram illustrating a high-voltage level shift circuit according to a second embodiment of the present invention. Current mirror circuits CM4 and CM5 are added to the configuration of the first embodiment. The current mirror circuit CM4 includes an NMOS3 and an NMOS4 which are NMOS transistors and inputs the output current of the current mirror circuit CM1 to the reference side. The current mirror circuit CM5 includes a PMOS5 and a PMOS6 which are PMOS transistors and inputs the output current of the current mirror circuit CM4 to the reference side. The I/V signal conversion circuit 1 receives the output of the current mirror circuit CM3 and the output of the current mirror circuit CM5, and obtains an output control voltage signal.

When an error signal current flows into the PMOS1, PMOS3, and T1 and T2 or the like, a gate potential and a drain potential of the PMOS1 and the PMOS3 are applied deeply according to current intensity. At this time, if current densities of the NMOS1 and the NMOS2 are reduced by increasing the transistor sizes of the NMOS1 and the NMOS2 and further suppressing the current ratio between the PMOS3 and the PMOS4, it is possible to reduce the gate potential and the drain potential of the NMOS1 and the NMOS2 compared to a case where the current densities are high. Furthermore, the gate potential and the drain voltage of the PMOS3 and the PMOS4 can be set so that a greater current is made to flow while keeping the ratio between the drain current of the PMOS3 and the drain current of the PMOS4 as the current mirror circuit.

In the configuration according to the first embodiment, the drain of the PMOS2 is directly connected to the drain of the NMOS2. For this reason, when a current based on an error signal current generated is made to flow from the PMOS2 to the NMOS2, the drain voltage applied to the PMOS2 may increase excessively according to the current value of the error signal, and the input voltage of the I/V signal conversion circuit 1 may decrease, causing the output to be erroneously inverted.

In contrast, according to the present embodiment, the current mirror circuits CM4 and CM5 are added. Therefore, the PMOS1 and the PMOS2 can also store input signals of the I/V signal conversion circuit 1 for a greater current as in the cases of the PMOS3 and PMOS4. Therefore, it is possible to cause a false current signal generated during high-voltage potential transition or the like to flow more greatly than in the first embodiment, and thereby enhance the malfunction prevention function.

Third Embodiment

Figure 6:
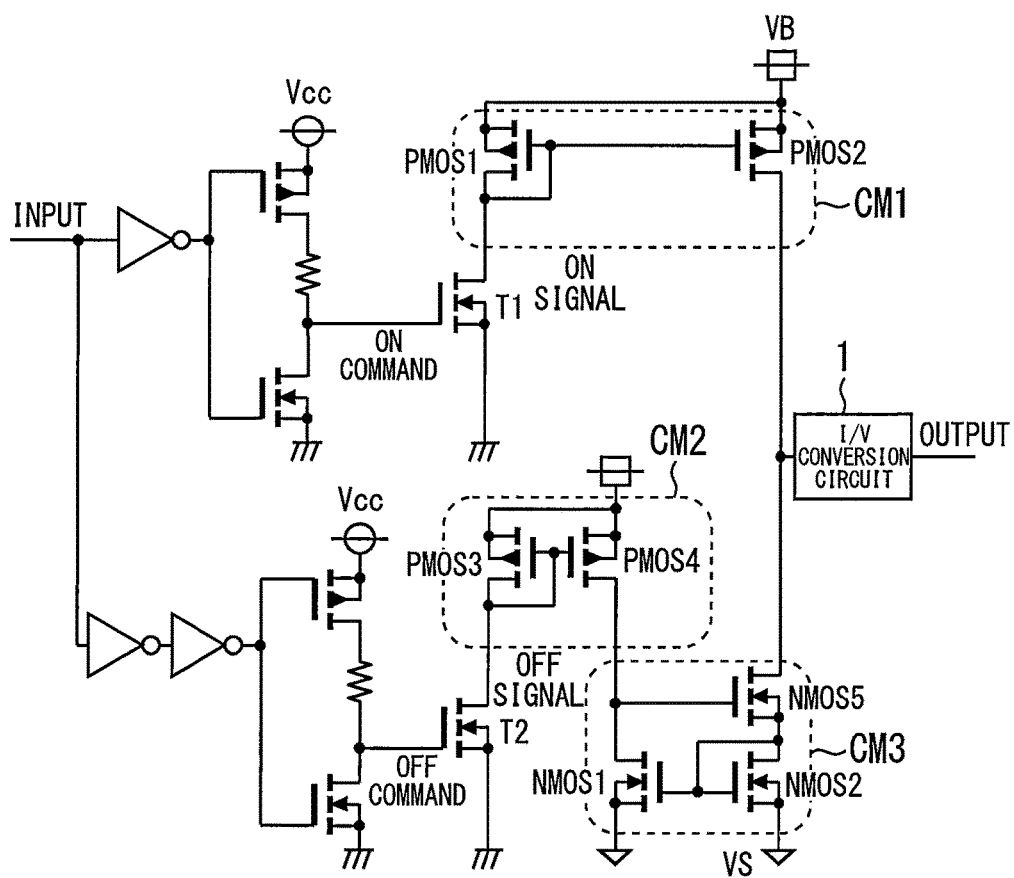
FIG. 6 is a diagram illustrating a high-voltage level shift circuit according to a third embodiment of the present invention.

FIG. 6 is a diagram illustrating a high-voltage level shift circuit according to a third embodiment of the present invention. Unlike the first embodiment, the current mirror circuit CM3 is a Wilson-type current mirror circuit with an NMOS 5 which is an NMOS transistor added to the NMOS1 and the NMOS2. In the Wilson-type current mirror circuit, an output current is fed back to a reference side current. Since a gate bias is applied to the NMOS1 and NMOS2 on the output side, if no current flows on the output side, no current flows on the reference side either.

When a DC signal is level-shifted according to the first and second embodiments, there is a state in which a steady current flows through parts of the PMOS4 and the NMOS1. On the other hand, according to the present embodiment, since the Wilson-type current mirror circuit is used, it is possible to eliminate steady currents in those parts. When the interior of the high-voltage side is in a low voltage state, charge is charged in a capacitor connected parallel to a high-voltage side power supply from a low-voltage side power supply. The charge is often used to supply a current to the interior of the high-voltage side. The present embodiment makes it possible to reduce current consumption in the interior of the high-voltage side.

Fourth Embodiment

Figure 7:
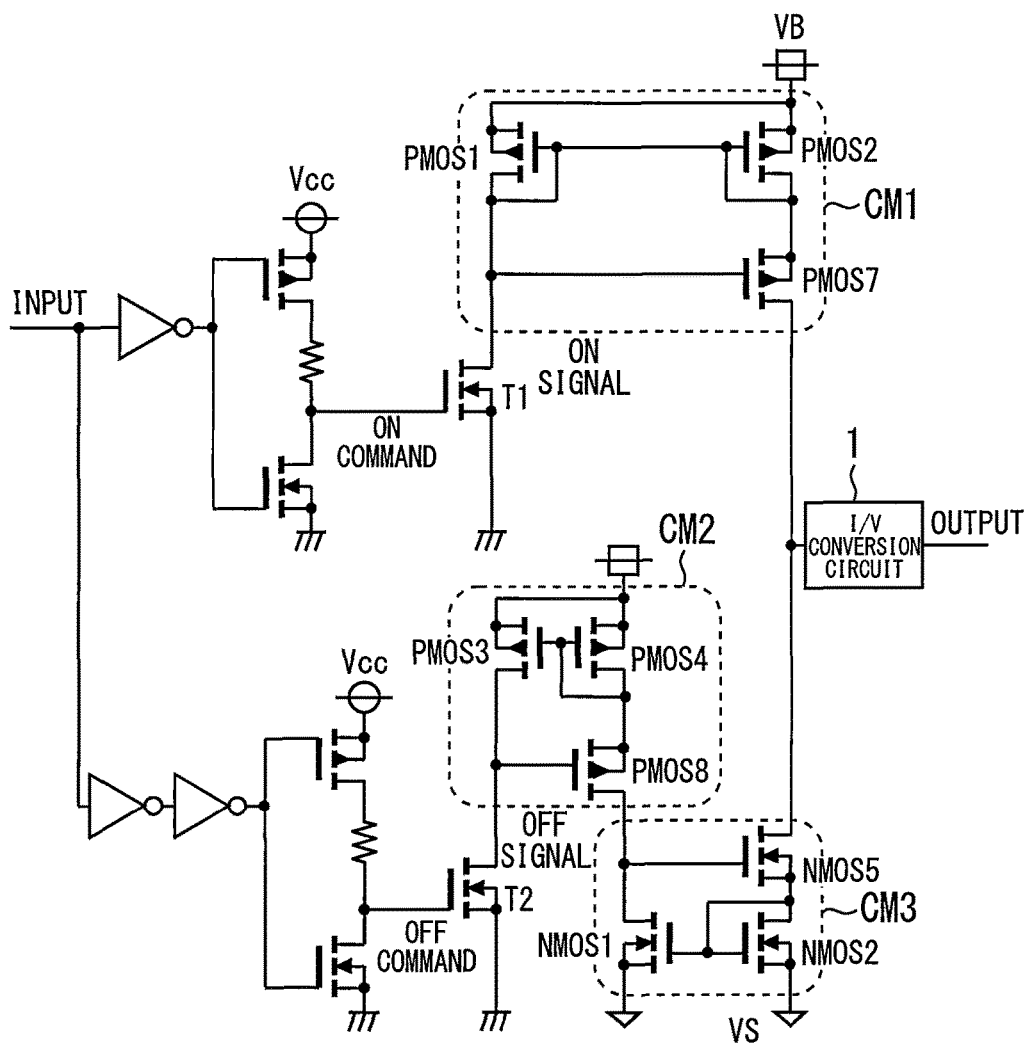
FIG. 7 is a diagram illustrating a high-voltage level shift circuit according to a fourth embodiment of the present invention.

FIG. 7 is a diagram illustrating a high-voltage level shift circuit according to a fourth embodiment of the present invention. The current mirror circuit CM1 is a Wilson-type current mirror circuit with a PMOS 7 which is a PMOS transistor added to the PMOS1 and the PMOS2 in addition to the configuration of the third embodiment. The current mirror circuit CM2 is also a Wilson-type current mirror circuit with a PMOS 8 which is a PMOS transistor added to the PMOS3 and the PMOS4. A current is supplied to the T1 and T2 from a high-voltage side power supply, but this steady current can also be reduced in the present embodiment. For example, when a diode is added, an anode of which is connected to the high-voltage side power supply and a cathode of which is connected to the drains of the T1 and T2, it is possible to reduce current consumption of the high-voltage side power supply while preventing an excessive voltage from being applied to high-voltage side devices.

Fifth Embodiment

Figure 8:
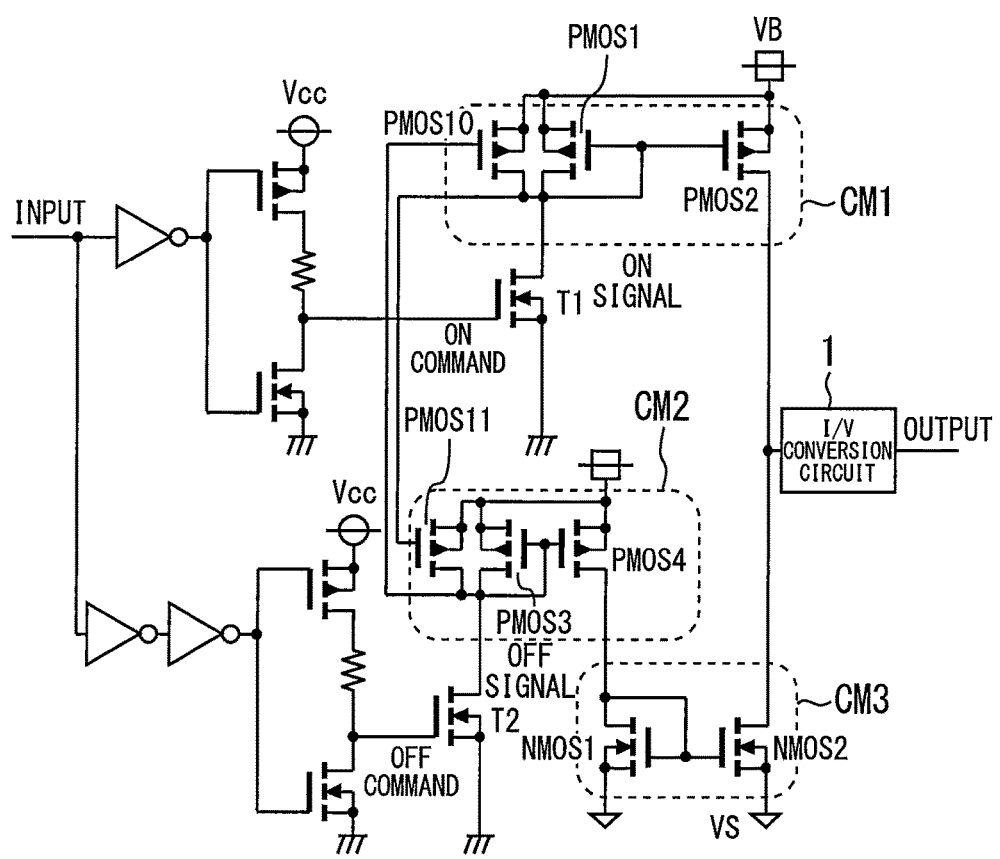
FIG. 8 is a diagram illustrating a high-voltage level shift circuit according to a fifth embodiment of the present invention.
Figure 9:
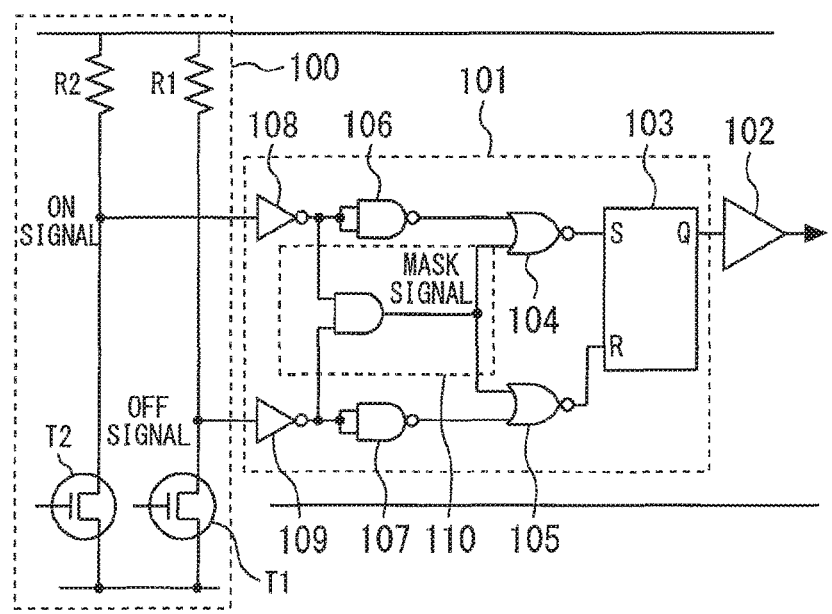
FIG. 9 is a diagram illustrating a conventional drive circuit.
Figure 10:
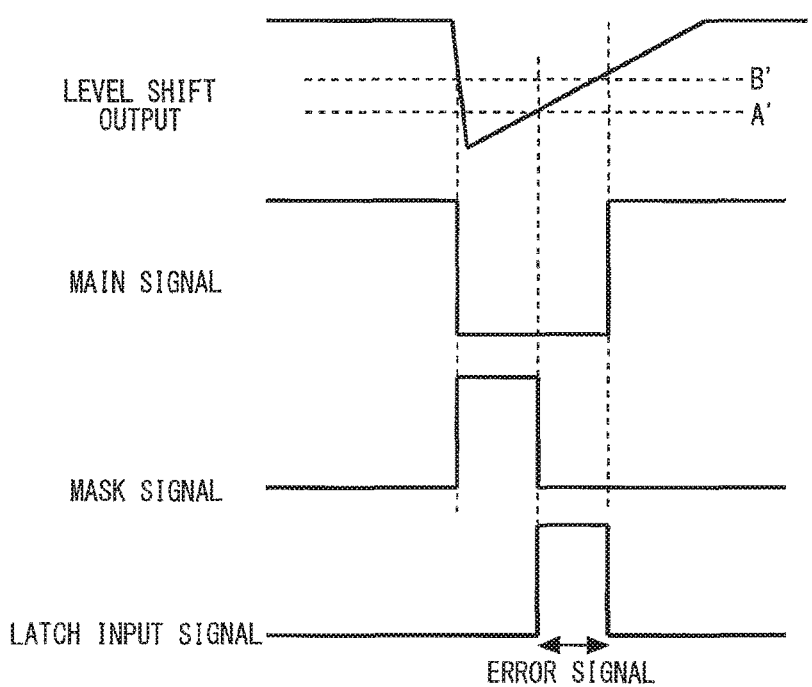
FIG. 10 is a timing chart illustrating operation of a conventional drive circuit.

FIG. 8 is a diagram illustrating a high-voltage level shift circuit according to a fifth embodiment of the present invention. A PMOS10 and a PMOS11 which are PMOS transistors are added to the configuration of the first embodiment. The PMOS10 is connected parallel to the source and the drain of the PMOS1 which is the reference side PMOS transistor of the current mirror circuit CM1. The PMOS11 is connected parallel to the source and the drain of the PMOS3 which is the reference side PMOS transistor of the current mirror circuit CM2. The gate of the PMOS10 is connected to the drain and the gate of the PMOS3 and is driven by a gate potential of the current mirror circuit CM2. The gate of the PMOS11 is connected to the drain and the gate of the PMOS1 and is driven by a gate potential of the current mirror circuit CM1.

For example, when an on signal is inputted to the high-voltage level shift circuit, the gate and the drain of the PMOS1 are biased and the PMOS11 is also biased likewise. However, since no off signal is inputted to the T2, no current flows via the PMOS11.

When an error signal current is generated due to high-voltage potential transition or the like, according to the first embodiment, a current flows through the PMOS3 as an error signal current and this error signal current is canceled out by the PMOS2 and the NMOS2 at a part connected to the I/V signal conversion circuit 1. On the other hand, according to the present embodiment, part of the error signal current flows into the T2 or the like via the gate-biased PMOS11. For this reason, the error signal current transmitted to the NMOS2 via the PMOS3 is already reduced at a part of the PMOS3. On the other hand, the PMOS10 is not gate-biased until an error signal current is made to flow into the PMOS11 or the PMOS3 and all the error signal current is made to flow into the T1 or the like via the PMOS1. Since an on signal is inputted to the T1 and PMOS1, a current further flows so as to enhance the on signal. That is, since only the error signal current is weakened by the PMOS11, it is possible to reinforce erroneous output inversion prevention. Note that the erroneous output inversion prevention is likewise reinforced when an off signal is inputted to the high-voltage level shift circuit.

In the present embodiment, although the logic transmission at the time of normal drive of the power device is similar to that of the first embodiment or the like, the transmission speed of the main signal can be increased. That is, when the T1 and T2 transition from an on state to an off state, it is necessary to charge a parasitic capacitance such as a back gate capacitance between the drain and the source of the T1 and T2, but this charging can be performed by the biased PMOS 10 and PMOS 11, and so the response speed improves.

Note that the PMOS10 and the PMOS11 are connected parallel to the PMOS1 and the PMOS3 according to the present embodiment, but even when a similar configuration is applied to the other current mirror circuits such as the NMOS1 and the NMOS2, similar effects can also be obtained.

As the power device driven by the drive circuit, a MOSFET made of a SiC material has a higher operation speed than an IGBT or MOSFET made of a Si material and has stronger dV/dt. Therefore, it is preferable to prevent malfunction by applying the high-voltage level shift circuit according to the first to fifth embodiments to the drive apparatus that drives the power device made of a SiC material such as SiMOSFET.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-087490, filed on Apr. 26, 2017 including specification, claims, drawings and summary, on which the Convention priority of the present application is based, is incorporated herein by reference in its entirety.

The invention claimed is:

1. A high-voltage level shift circuit comprising:
   a first high withstand voltage NMOS transistor driven by an on command;
   a second high withstand voltage NMOS transistor driven by an off command;
   a first PMOS current mirror circuit inputting a drain current of the first high withstand voltage NMOS transistor to a reference side;
   a second PMOS current mirror circuit inputting a drain current of the second high withstand voltage NMOS transistor to a reference side;
   a first NMOS current mirror circuit inputting an output current of the second PMOS current mirror circuit to a reference side, a gate and a drain of an NMOS transistor of the first NMOS current mirror circuit are mutually connected and are also directly connected to a drain of a PMOS transistor of the second PMOS current mirror circuit; and
   an I/V signal conversion circuit receiving an output of the first PMOS current mirror circuit and an output of the first NMOS current mirror circuit to obtain an output control voltage signal.

2. The high-voltage level shift circuit according to claim 1, further comprising:
   a second NMOS current mirror circuit inputting an output current of the first PMOS current mirror circuit to a reference side; and
   a third PMOS current mirror circuit inputting an output current of the second NMOS current mirror circuit to a reference side,
   wherein the I/V signal conversion circuit receives an output of the first NMOS current mirror circuit and an output of the third PMOS current mirror circuit to obtain an output control voltage signal.

3. The high-voltage level shift circuit according to claim 1, wherein the first NMOS current mirror circuit is a Wilson-type current mirror circuit in which an output current is fed back to a reference side current.

4. The high-voltage level shift circuit according to claim 1, wherein the first and second PMOS current mirror circuits are Wilson-type current mirror circuits in which an output current is fed back to a reference side current.

5. The high-voltage level shift circuit according to claim 1, further comprising:
   a first PMOS transistor connected parallel to a source and a drain of a reference side PMOS transistor of the first PMOS current mirror circuit; and
   a second PMOS transistor connected parallel to a source and a drain of a reference side PMOS transistor of the second PMOS current mirror circuit,
   wherein a gate of the first PMOS transistor is driven by a gate potential of the second PMOS current mirror circuit, and
   a gate of the second PMOS transistor is driven by a gate potential of the first PMOS current mirror circuit.

6. The high-voltage level shift circuit according to claim 1, wherein the I/V signal conversion circuit is a latch circuit.

7. The high-voltage level shift circuit according to claim 6, wherein the I/V signal conversion circuit performs latch operation only when no signal is inputted.

8. A drive apparatus comprising the high-voltage level shift circuit according to claim 1, wherein the drive apparatus drives a power device made of a SiC material.

* * * * *